(12) United States Patent
Park

(10) Patent No.: US 11,705,405 B2
(45) Date of Patent: Jul. 18, 2023

(54) PACKAGED SEMICONDUCTOR DEVICES HAVING SPACER CHIPS WITH PROTECTIVE GROOVE PATTERNS THEREIN

(71) Applicant: Samsung Electronics Co., Ltd., Suwon-si (KR)

(72) Inventor: Jiwoo Park, Asan-si (KR)

(73) Assignee: Samsung Electronics Co., Ltd.

( * ) Notice: Subject to any disclaimer, the term of this patent is extended or adjusted under 35 U.S.C. 154(b) by 30 days.

(21) Appl. No.: 17/307,266

(22) Filed: May 4, 2021

(65) Prior Publication Data

US 2022/0059473 A1  Feb. 24, 2022

(30) Foreign Application Priority Data

Aug. 19, 2020 (KR) .................. 10-2020-0103752

(51) Int. Cl.
*H01L 25/18* (2023.01)
*H01L 23/00* (2006.01)
*H01L 25/065* (2023.01)

(52) U.S. Cl.
CPC ........ *H01L 23/562* (2013.01); *H01L 25/0652* (2013.01); *H01L 25/0657* (2013.01); *H01L 25/18* (2013.01); *H01L 2225/0651* (2013.01); *H01L 2225/06506* (2013.01); *H01L 2225/06562* (2013.01); *H01L 2225/06575* (2013.01); *H01L 2225/06586* (2013.01)

(58) Field of Classification Search
CPC ............. H01L 25/0652; H01L 25/0655; H01L 25/0657; H01L 23/28; H01L 23/31–3128; H01L 23/16; H01L 23/24; H01L 2224/2612; H01L 2224/27011
See application file for complete search history.

(56) References Cited

U.S. PATENT DOCUMENTS 6,855,577 B2  2/2005 Azuma
8,766,100 B2  7/2014 Yuan et al.
(Continued)

FOREIGN PATENT DOCUMENTS

JP  2002057272 A  2/2002
JP  2008311551 A  12/2008
(Continued)

OTHER PUBLICATIONS

Image original and machine translation to English, Maeda (TW-202133355-A) (Year: 2021) (Year: 2021).*
(Continued)

*Primary Examiner* — Nicholas J Tobergte
*Assistant Examiner* — William H Anderson
(74) *Attorney, Agent, or Firm* — Myers Bigel, P.A.

(57) ABSTRACT

A packaged integrated circuit device includes a substrate having a spacer chip thereon, which is devoid of active integrated circuits therein but which has a stress-relieving pattern of grooves in an upper surface thereof. A first semiconductor chip is provided, which is bonded to the upper surface of the spacer chip. A molded region is provided, which includes a passivating resin that: (i) at least partially surrounds the first semiconductor chip and the spacer chip, and (ii) extends into at least a portion of the grooves within the upper surface of the spacer chip.

18 Claims, 9 Drawing Sheets

(56) References Cited

U.S. PATENT DOCUMENTS

| | | | |
|---|---|---|---|
| 9,355,969 B2 | 5/2016 | Park | |
| 2005/0046002 A1 | 3/2005 | Lee et al. | |
| 2009/0001613 A1* | 1/2009 | Yun | H01L 23/16 |
| | | | 257/E23.116 |
| 2011/0175222 A1* | 7/2011 | Kim | H01L 23/3128 |
| | | | 257/737 |
| 2020/0402885 A1* | 12/2020 | Kim | H01L 23/3128 |
| 2021/0050309 A1* | 2/2021 | Chang | H01L 23/16 |
| 2021/0257336 A1* | 8/2021 | Maeda | H01L 21/563 |

FOREIGN PATENT DOCUMENTS

| | | | | |
|---|---|---|---|---|
| JP | 2018041871 A | | 3/2018 | |
| JP | 2020096153 A | * | 6/2020 | H01L 21/78 |
| KR | 20050021078 A | | 3/2005 | |
| KR | 101349591 B1 | | 1/2014 | |
| KR | 101996935 B1 | | 7/2019 | |
| TW | 202133355 A | * | 9/2021 | H01L 21/30625 |

OTHER PUBLICATIONS

Image original and machine translation to English, Chiu (JP-2020096153) (Year: 2020) (Year: 2020).*

* cited by examiner

I-I'

I1-I1'

I2-I2'

II-II'

PACKAGED SEMICONDUCTOR DEVICES HAVING SPACER CHIPS WITH PROTECTIVE GROOVE PATTERNS THEREIN

REFERENCE TO PRIORITY APPLICATION

This application claims priority to Korean Patent Application No. 10-2020-0103752, filed Aug. 19, 2020, the disclosure of which is hereby incorporated herein by reference.

BACKGROUND

The present inventive concept relates to integrated circuit devices and, more particularly, packaged integrated circuit devices.

Recently, demand for portable devices has rapidly increased in the electronic products market, and, as a result, miniaturization and lightening of electronic components mounted in such electronic products are continuously being pursued. In order to reduce the size and weight of electronic components, semiconductor packages mounted thereon may need to process high-capacity data while their volumes are reduced. There is a need for high integration and single packaging of semiconductor chips mounted in such semiconductor packages. Accordingly, a semiconductor package having a stack structure may be utilized to allow semiconductor chips to be more efficiently arranged within a limited semiconductor package structure.

SUMMARY

An example embodiment of the inventive concept is to provide semiconductor packages that may maintain reliability while efficiently arranging semiconductor chips in a limited space within the package.

According to an example embodiment, a semiconductor package includes a package substrate and at least one lower semiconductor chip disposed on the package substrate. At least one spacer chip is provided, which is also disposed on the package substrate. This spacer chip may be a nonfunctioning chip and may have a groove pattern arranged in an upper surface thereof. An upper semiconductor chip is also provided, which is disposed on the at least one lower semiconductor chip and the at least one spacer chip. This upper semiconductor chip covers an upper surface of the at least one lower semiconductor chip and the upper surface of the at least one spacer chip. A non-conductive adhesive layer is provided, which is disposed on a lower surface of the upper semiconductor chip, and is bonded to the upper surfaces of the at least one lower semiconductor chip and the at least one spacer chip. A molded portion (e.g., mold layer/region) is provided, which is disposed on the package substrate, and surrounds the at least one of lower and upper semiconductor chips and the at least one spacer chip.

According to an example embodiment of the present inventive concept, a semiconductor package includes a package substrate, and a lower semiconductor chip disposed on the package substrate. A plurality of spacer chips are provided, which are disposed on the package substrate. One or more of these spacer chips has an upper surface thereon in which a plurality of grooves are arranged in a grid shape. An upper semiconductor chip is provided, which is disposed on the lower semiconductor chip and on the plurality of spacer chips and which covers upper surfaces of the lower semiconductor chip and the plurality of spacer chips. An electrically nonconductive adhesive layer is provided, which is disposed on a lower surface of the upper semiconductor chip, and which is bonded to upper surfaces of the lower semiconductor chip and the plurality of spacer chips. This adhesive layer may at least partially fill the plurality of grooves in the upper surfaces of the spacer chips. A molded portion is also provided as a passivation layer/region, which is disposed on the package substrate, and which surrounds the lower and upper semiconductor chips, and the plurality of spacer chips. Advantageously, the molded portion fills in a space(s) between the lower semiconductor chip and the plurality of spacer chips, which is covered by the upper semiconductor chip.

According to another embodiment of the present inventive concept, a packaged integrated circuit device includes a package substrate, and a first lower semiconductor chip, which extends on the package substrate and has a first thickness. A second lower semiconductor chip is also provided, which extends on the package substrate, and has a second thickness, which is less than the first thickness. A spacer chip is also provided, which extends on the second lower semiconductor chip. The spacer chip has an upper surface, which contains a plurality of grooves therein that are arranged in a grid shape. An upper semiconductor chip is provided, which is disposed on the first lower semiconductor chip and the spacer chip. The upper semiconductor chip covers upper surfaces of the first lower semiconductor chip and the spacer chip. An electrically nonconductive adhesive layer is provided, which is disposed on a lower surface of the upper semiconductor chip. This adhesive layer is bonded to upper surfaces of the first lower semiconductor chip and the spacer chip, and at least partially fills the plurality of grooves. A molded portion is provided as an encapsulating passivation layer. This molded portion, which is provided on the package substrate, at least partially surrounds the first and second lower semiconductor chips, the upper semiconductor chip, and the spacer chip.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, example embodiments of the present inventive concept will be described in detail with reference to the accompanying drawings.

Figure 1:
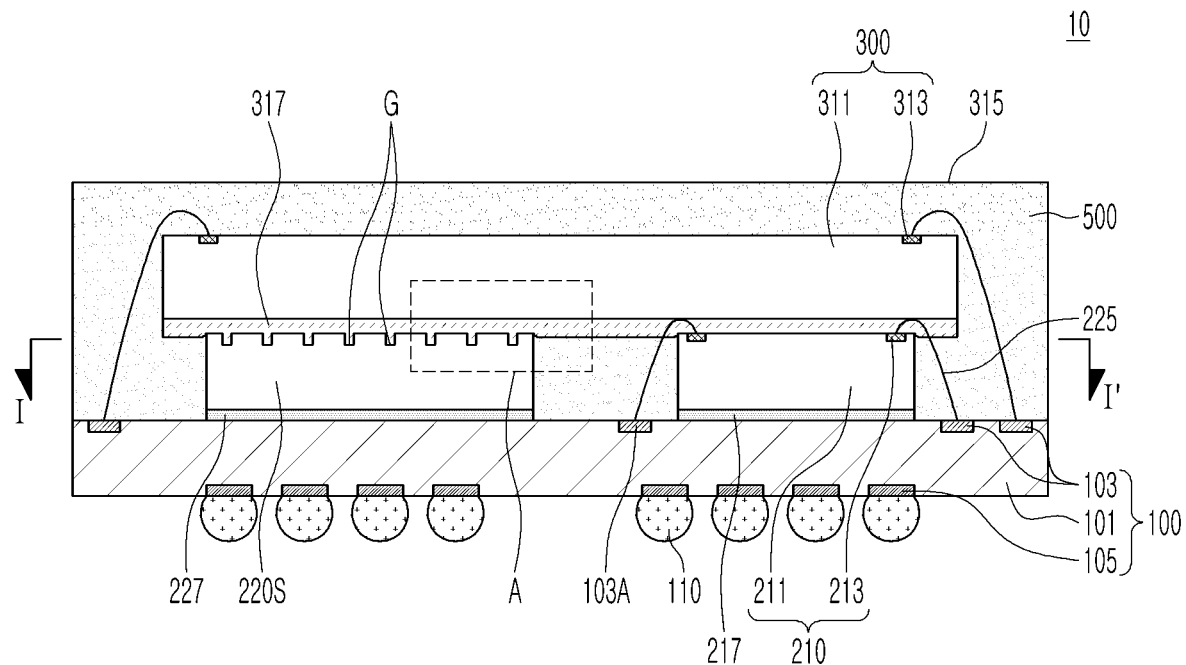
FIG. 1 is a side cross-sectional side view of a semiconductor package according to an example embodiment of the present inventive concept.
Figure 2:
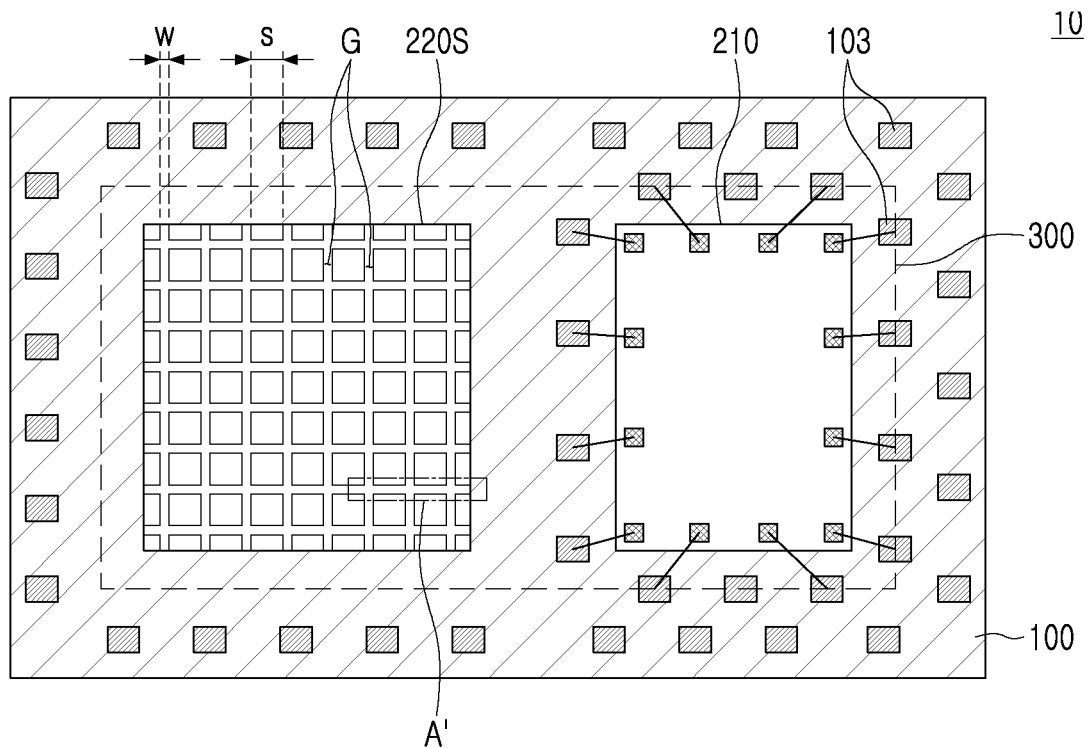
FIG. 2 is a plan view taken along line I-I' of the semiconductor package of FIG. 1.

FIG. 1 is a side cross-sectional side view of a semiconductor package according to an example embodiment of the present inventive concept, and FIG. 2 is a plan view taken along line I-I' of the semiconductor package of FIG. 1. Referring to FIGS. 1 and 2, a semiconductor package 10 according to the present example embodiment includes a package substrate 100, a lower semiconductor chip 210 disposed on the package substrate 100, a spacer chip 220S, and an upper semiconductor chip 300 disposed on the lower semiconductor chip 210 and the spacer chip 220S. A plane of FIG. 2 is mainly illustrated in an arrangement of the lower semiconductor chip 210 and the spacer chip 220S, and the upper semiconductor chip 300 is schematically illustrated by dotted lines.

The package substrate 100 may include a body portion 101, an upper pad 103 disposed on an upper surface of the body portion 101, and a lower pad 105 disposed on a lower surface of the body portion 101. In addition, the package substrate 100 may have a wiring pattern (not illustrated) and/or a connection via (not illustrated) electrically connecting the upper pad 103 and the lower pad 105. In some example embodiments, portions of the upper pad 103 and the lower pad 105 may be ground pads.

The package substrate 100 may be a wiring substrate such as a printed circuit board. The package substrate 100 is not limited to a printed circuit board, but may be various types of wiring substrates. For example, the body portion 101 of the package substrate 100 may be made of at least one material selected from a phenol resin, an epoxy resin, and a polyimide. For example, the package substrate 100 may include FR4, a tetrafunctional epoxy resin, polyphenylene ether, epoxy/polyphenylene oxide, bismaleimidetriazine (BT), Thermount, cyanate ester, polyimide, and/or liquid crystal polymer. In addition, the upper pad 103, the lower pad 105, the wiring pattern, and the connection via may include, for example, copper (Cu), nickel (Ni), aluminum (Al), and/or beryllium copper.

An external connection terminal 110 may be formed on the lower pad 105 of the package substrate 100. The external connection terminal 110 may include, for example, a solder ball, a conductive bump, a conductive paste, a ball grid array (BGA), a lead grid array (LGA), or a pin grid array (PGA), or a combination thereof.

A lower semiconductor chip 210 may include a semiconductor substrate 211 having an active surface and an inactive surface located opposite to the active surface. The active surface of the semiconductor substrate 211 (also referred to as the "upper surface" of the lower semiconductor chip in this embodiment) may be a surface on which a plurality of active/passive elements (e.g., transistors) and bonding pads 213 connected thereto are formed, and the inactive surface (also referred to as the "lower surface" of the lower semiconductor chip in this embodiment) may be a surface facing the upper surface of the package substrate 100.

The lower semiconductor chip 210 may be bonded to the upper surface of the package substrate 100 using an electrically nonconductive adhesive layer 217. The lower semiconductor chip 210 may be electrically connected to the package substrate 100 by a wire 215. The wire 215 may connect the bonding pads 213 of the lower semiconductor chip 210 to some pads of the upper pads 103, respectively.

In this embodiment, similar to the lower semiconductor chip 210, an upper semiconductor chip 300 may include a semiconductor substrate 311 having an active surface and an inactive surface located opposite to the active surface. The active surface of the semiconductor substrate 311 (also referred to as the "upper surface" of the semiconductor chip in this embodiment) may be a surface in which a plurality of active/passive elements (e.g., transistor) and bonding pads 313 connected thereto are formed, and the inactive surface thereof (also referred to as the "lower surface" of the upper semiconductor chip) may be a surface facing the upper surface of the package substrate 100 or the upper surface of the lower semiconductor chip 210. In a similar manner to the lower semiconductor chip 210, the upper semiconductor chip 300 may be electrically connected to the package substrate 100 by a wire 315. The wire 315 may connect the bonding pads 313 of the upper semiconductor chip 300 and a portion of the upper pads 103.

The upper semiconductor chip 300 may be bonded to the upper surfaces of the lower semiconductor chips 210 and the spacer chip 220S using an electrically nonconductive adhesive layer 317. In some example embodiments, the adhesive layer 317 may be first provided on the lower surface of the upper semiconductor chip 300 and then bonded to the upper surfaces of the lower semiconductor chip 210 and the spacer chip 220S.

The spacer chip 220S may be provided as a lower structure for stably supporting the upper semiconductor chip 300 together with the lower semiconductor chip 210 having a relatively small area. The spacer chip 220S may be bonded to the upper surface of the package substrate 100 using an adhesive layer 227 similar to the lower semiconductor chip 210. The spacer chip 220S may be made of a substrate of the same or similar material as the semiconductor substrate of the lower semiconductor chip. For example, the spacer chip 220S may include a silicon (Si) substrate.

The spacer chip 220S may have an upper surface in which a groove (G) pattern is arranged. The groove pattern employed in the present example embodiment may include a plurality of grooves G arranged in a grid shape. As shown in FIG. 2, the plurality of grooves G may extend to edges of the upper surface of the spacer chip 220S. The plurality of grooves G may provide a non-flat bonding interface to enhance bonding strength between the non-conductive adhesive layer 317 and the spacer chip 220S.

The semiconductor package 10 employed in the present example embodiment may further include a molded portion 500 (e.g., resin mold layer/region) surrounding the lower semiconductor chip 210, the spacer chip 220S, and the upper semiconductor chip 300. This molded portion 500 may operate as an encapsulating passivation layer, for example.

Thus, the molded portion 500 may serve to protect the lower semiconductor chip 210, the spacer chip 220S and the upper semiconductor chip 300 from the outside.

For example, the molded portion 500 may be formed through a curing process by injecting an uncured resin for the molded portion 500 onto the package substrate 100 in an appropriate amount. In a process of forming the molded portion 500, pressure may be applied to a molding resin by a pressing means such as a press. Here, process conditions such as a delay time between injection and pressurization of the molding resin, an amount of the injected molding resin, pressurization temperature/pressure, and the like, may be set in consideration of physical properties such as viscosity, or the like, of the molding resin.

In the process of forming the molded portion 500, the uncured resin for the molded portion 500 may flow into a bonding interface region (marked as "B" and "B'"), adjacent to an edge of the upper surface of the spacer chip 220S, as shown by an arrow marked as "R", from a space between the lower semiconductor chip 210 and the spacer chip 220S, covered by the upper semiconductor chip 300. In particular, since typically high pressure is applied during the process of forming the molded portion 500, the uncured resin flowing into the bonding interface may be provided as a cause of mechanical damage such as a crack in the upper semiconductor chip 300. However, in this embodiment, since a path of a material that is arranged adjacent to the edge of the spacer chip 220S by the plurality of grooves G, and can flow into the bonding interface (and grooves) from the outside may be extended or bent, the plurality of grooves G disposed on the upper surface of the spacer chip 220S can effectively prevent damage to the upper semiconductor chip 300.

In consideration of this effect, the size and arrangement of the plurality of grooves G can be variously designed. The plurality of grooves G may extend to edges of the upper surface of the spacer chip 220S, as shown in FIG. 2. For example, a width (w) of each of the grooves G may have a range of 15 μm to 30 μm. In some example embodiment, while obtaining a sufficient effect by the groove pattern, a depth (d) of the plurality of grooves G may be set, so that no voids remain inside the plurality of grooves G after the non-conductive adhesive layer 317 is applied. For example, the depth (d) of each of the grooves G may be in a range from 0.5 μm to 3 μm. In addition, an interval (s) of the plurality of grooves G may be at least 1.5 times the width (w) of each of the grooves G. For example, the spacing (s) of the plurality of grooves G may be in a range from 20 μm to 100 μm.

Each cross-section of the plurality of grooves G may have a cross section of various shapes. In some embodiments, each cross-section of the plurality of grooves G may have a shape having an upper width, greater than a lower width. For example, each cross-section of the plurality of grooves G may have a shape such as an inverted trapezoid, an inverted triangle, or a shape having a curved bottom surface. The cross-section of the plurality of grooves G may be determined by a forming process. For example, when a plurality of grooves G are formed using a blade, it may be determined by the cross-sectional shape of the blade.

As described above, the upper semiconductor chip 300 may be bonded to upper surfaces of the lower semiconductor chip 210 and the spacer chip 220S by a non-conductive adhesive layer 317, and in the present example embodiment, the upper semiconductor chip 300 may be disposed to cover the upper surfaces of the lower semiconductor chip 210 and the spacer chip 220S. The upper semiconductor chip 300 may have a larger mounting area than the lower semiconductor chip 210 and the spacer chip 220S, but the present inventive concept is not limited thereto, in other example embodiments, the upper semiconductor chip 300 may not cover a region of the upper surface of the lower semiconductor chip 210 or the upper surface of the spacer chip 220S.

In some example embodiments, the non-conductive adhesive layer 317 may be provided as a fixing means for bonding the lower semiconductor chip 210, the spacer chip 220S, and the upper semiconductor chip 300, and may include an adhesive resin layer, such as a non-conductive film (NCF) a direct adhesive film (DAF) or a film over wire (FOW). For example, the adhesive resin layer may include a bisphenol-type epoxy resin, a noblock-type epoxy resin, a phenol resin, a urea resin, a melamine resin, an unsaturated polyester resin, and a resorcinol resin, and a combination thereof. The non-conductive adhesive layer 317 has a certain thickness, and this thickness may provide a space for a portion of the wire 215 connected to the bonding pad 213 located on the upper surface of the lower semiconductor chip 210. The molded portion 500 may include an epoxy-group molding resin or a polyimide-group molding resin. For example, the molding member 500 may include an epoxy molding compound (EMC) or a High-K epoxy molding compound. Meanwhile, the adhesive layers 217 and 227 may also be adhesive resin layers such as a direct adhesive film (DAF) or a film over wire (FOW), similar to the non-conductive adhesive layer 317.

In some embodiments, the lower semiconductor chip 210 may be a processor chip. For example, the lower semiconductor chip 210 may include a microprocessor, a graphics processor, a signal processor, a network processor, a chipset, an audio codec, a video codec, an application processor, or a system on chip, but is not limited thereto. For example, the lower semiconductor chip 210 may be a control chip for driving a memory device.

In some embodiments, the upper semiconductor chip 300 may be volatile memory chips and/or non-volatile memory chips. For example, the volatile memory chip may include a dynamic random access memory (DRAM), a static RAM (SRAM), a thyristor RAM (TRAM), a zero capacitor RAM (ZRAM), or a twin transistor RAM (TTRAM). In addition, the non-volatile memory chip may include, for example, a flash memory, a magnetic RAM (MRAM), a spin-transfer torque MRAM (STT-MRAM), a ferroelectric RAM (FRAM), a phase change RAM (PRAM), a resistive RAM (RRAM), a nanotube RRAM, a polymer RAM, a nano-floating gate memory, a holographic memory, a molecular electronics memory, or an insulator resistance change memory.

As described above, the groove pattern formed on the upper surface of the spacer chip may be formed in various arrangements. These various groove patterns will be described with reference to FIGS. 4 to 6. FIGS. 4 to 6 are plan and cross-sectional views of a spacer chip employable in this embodiment.

Figure 4A:
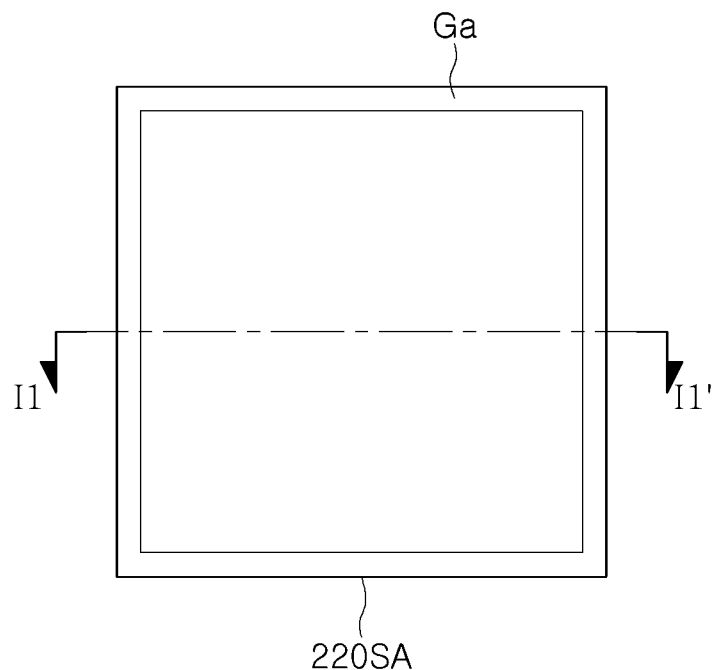
FIGS. 4A and 4B are plan and side cross-sectional views (along line I1-I1'), respectively, of a spacer chip employable in an example embodiment of the present inventive concept.
Figure 4B:
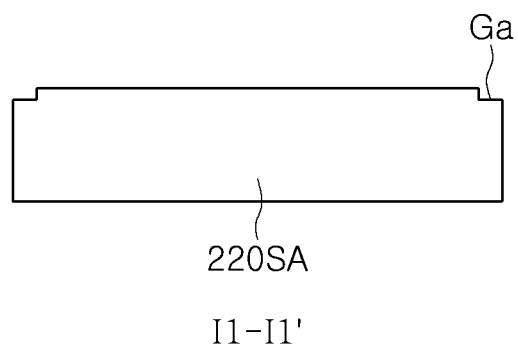

Referring to FIGS. 4A and 4B, the spacer chip 220SA has a plurality of grooves Ga spaced apart from respective edges of the upper surface of the spacer chip 220SA and extend along the respective edges. The groove Ga may be formed along four sides of the spacer chip 220SA, and as shown in FIG. 4B, the groove Ga may provide a protrusion structure (or a step structure) in a direction entering the inside from the outside of the edge. This protrusion structure may effectively suppress the inflow of uncured resin for the molded portion 500 along the bonding interface from the space between the lower semiconductor chip 210 and the spacer chip 220SA covered by the upper semiconductor chip 300.

Figure 5A:
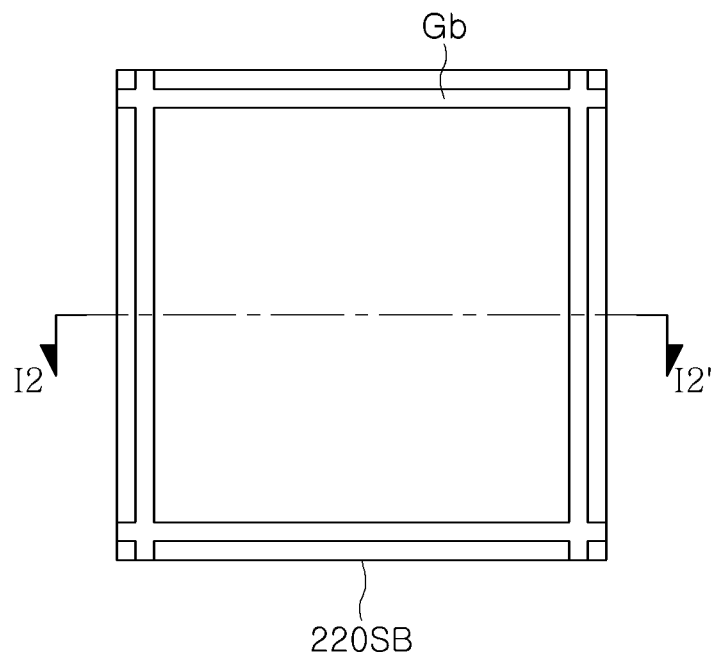
FIGS. 5A and 5B are plan and side cross-sectional views (along line I2-I2'), respectively, of a spacer chip employable in an example embodiment of the present inventive concept.
Figure 5B:
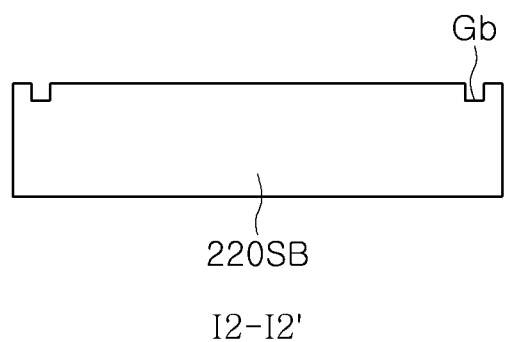

Referring to FIGS. 5A and 5B, the spacer chip 220SB has a plurality of grooves Gb spaced apart from respective edges of the upper surface of the spacer chip 220SB and extend along the respective edges. Each of the plurality of grooves Ga may be provided on four sides of the spacer chip 220SA. The plurality of grooves Gb employed in the present embodiment may extend to edges of the upper surface of the spacer chip 220SB. As shown in FIG. 4B, the groove Gb may also provide a concave structure in a direction from the outside of the edge to the inside in a region, similarly adjacent to the edge, and may effectively suppress the inflow of uncured resin along the bonding interface during the process of the molded portion.

The groove patterns exemplified in the various arrangements described above may be implemented single or combined form. For example, the grooves Ga illustrated in FIG. 4A may be coupled together with the grooves G in a grid arrangement of the spacer chip 220S illustrated in FIG. 2.

Figure 6A:
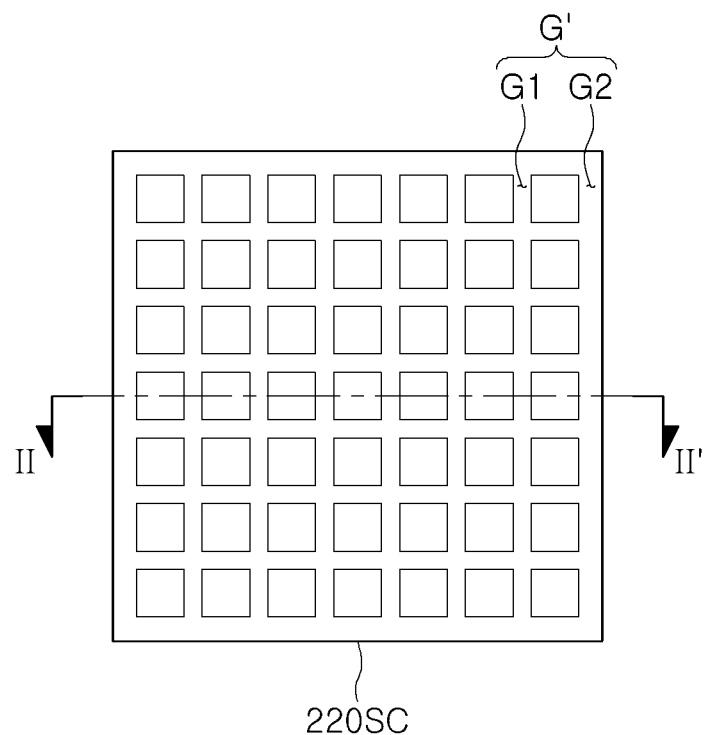
FIGS. 6A and 6B are plan and side cross-sectional views (along line II-II'), respectively, of a spacer chip employable in an example embodiment of the present inventive concept.
Figure 6B:
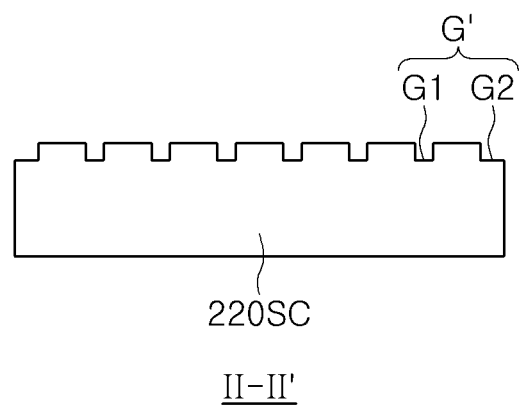

Referring to FIGS. 6A and 6B, a groove pattern G' (G1+G2) implemented in a spacer chip 220SC may include grooves G2 extending along respective edges of the upper surface thereof, together with the plurality of grooves G1 arranged in a grid shape on the upper surface of the spacer chip 220SB. As described above, the groove pattern employable in the spacer chip according to the present embodiment may be implemented in various combinations of the above-described arrangement examples.

Meanwhile, in the above-described embodiment (see FIGS. 1 and 2), although a semiconductor package 10 including one lower semiconductor chip 210, one spacer chip 220S, and one upper semiconductor chip 300 is illustrated, in other embodiments, the number and/or arrangement of each of the chips may be variously changed. In some embodiments, at least one semiconductor chip may have a chip stack structure in which a plurality of semiconductor chips are stacked (see FIG. 8).

Figure 7:
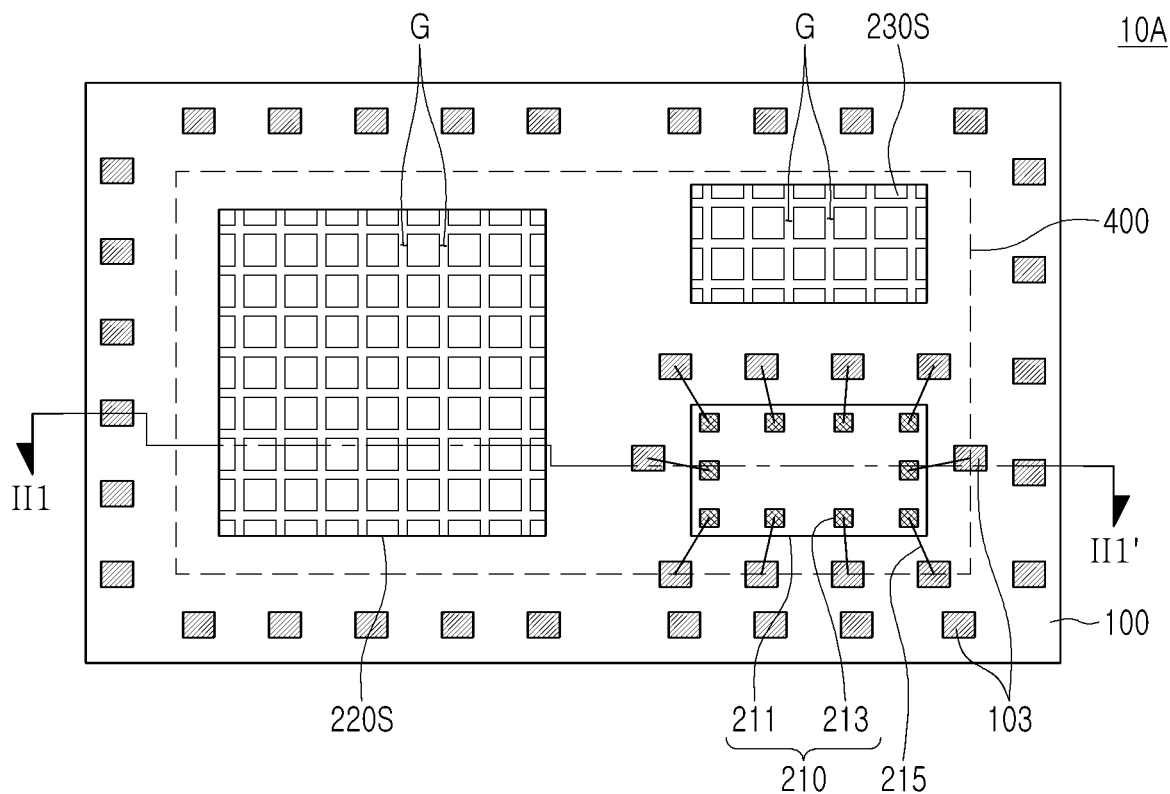
FIG. 7 is a plan view of a semiconductor package according to an example embodiment of the present inventive concept.
Figure 8:
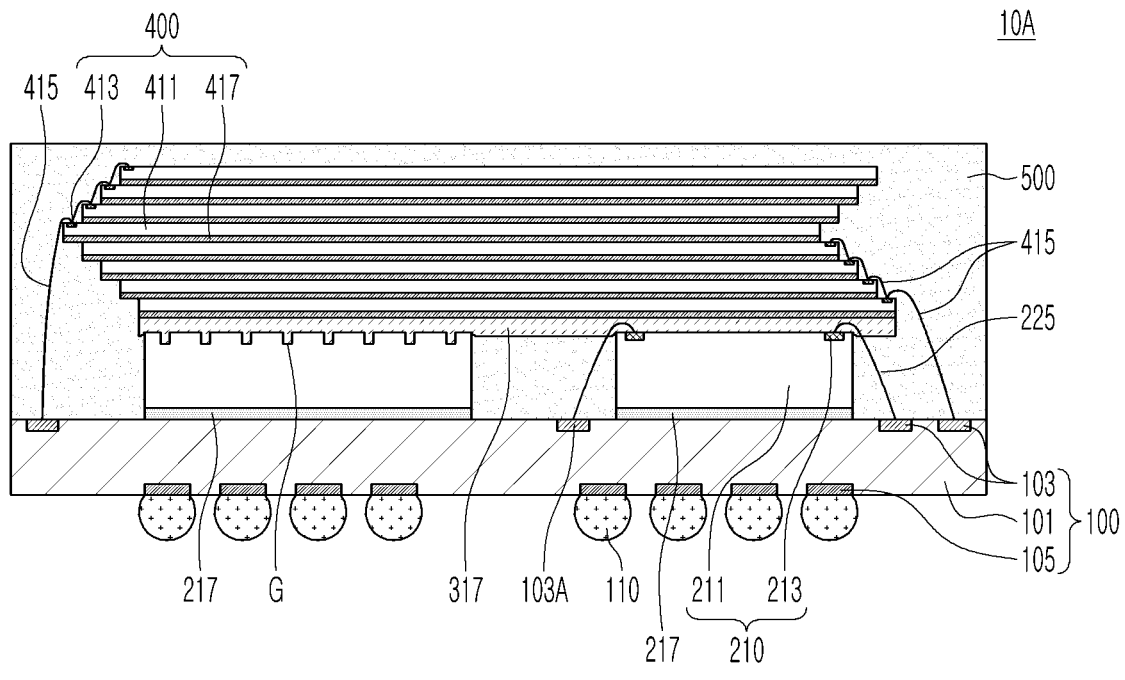
FIG. 8 is a cross-sectional view taken along line III1-III1' of the semiconductor package of FIG. 7.

FIG. 7 is a plan view of a semiconductor package according to an example embodiment of the present inventive concept, and FIG. 8 is a cross-sectional view of the semiconductor package of FIG. 7 taken along lines III1-III1'.

Figure 3:
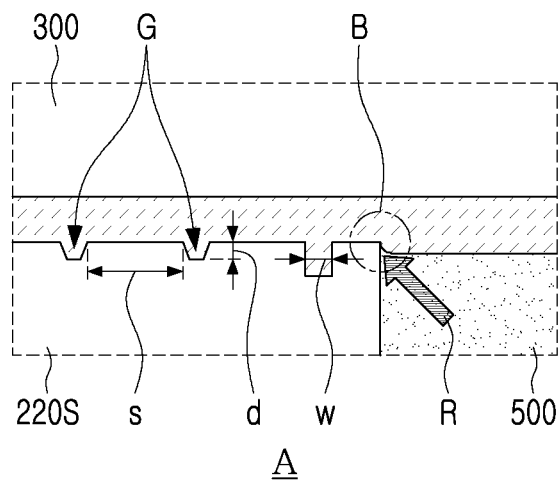
FIG. 3 is a partial enlarged view of portion "A" of the semiconductor package of FIG. 1 and portion "A' " of the semiconductor package of FIG. 2.
Figure 3:
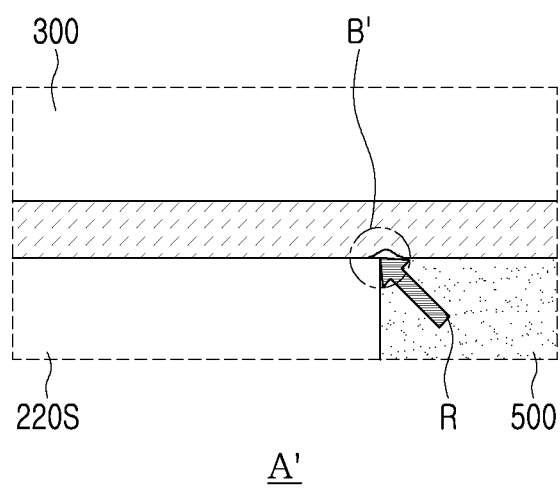

Referring to FIGS. 7 and 8, it may be understood that a semiconductor package 10B according to the present example embodiment has a structure, similar to the example embodiment shown in FIGS. 1 to 3, except that two spacer chips 220S and 230S are introduced, and the upper semiconductor chip 400 is a chip stack structure. Accordingly, the description of the embodiment shown in FIGS. 1 to 3 may be combined with the description of the present embodiment unless otherwise specified.

The semiconductor package 10A according to the present example embodiment may include a package substrate 100, a lower semiconductor chip 210 disposed on the package substrate 100, first and second spacer chips 220S and 230S disposed on the package substrate 100, a lower semiconductor chip 210, and an upper semiconductor chip 400 disposed on the first and second spacer chips 220S and 230S.

The first and second spacer chips 220S and 230S employed in this embodiment are lower structures stably supporting the upper semiconductor chip 300 and may have different areas. For example, the first spacer chip 220S may have a size larger than that of the second spacer chip 230S.

As shown in FIG. 7, the first spacer chip 220S may be arranged adjacent to one side of the package substrate 100, and the second spacer chip 230S may be arranged parallel to the lower semiconductor chip 210, between the other side of the package substrate 100 and an edge of the first spacer chip 220S.

The upper semiconductor chip 400 may be bonded to the upper surface of the lower semiconductor chip 210 and the upper surfaces of the first and second spacer chips 220S and 230S by the non-conductive adhesive layer 317. The upper semiconductor chip 400 may be disposed to cover the upper surface of the lower semiconductor chip 210 and the upper surfaces of the first and second spacer chips 220S and 230S. The upper semiconductor chip 400 may have an area larger than that of the upper surface of the lower semiconductor chip 210 and a region in which the first and second spacer chips 220S and 230S are mounted.

The upper semiconductor chip 400 may be a chip stack structure. The upper semiconductor chip 400 may be a chip stack structure in which a plurality of memory chips 411 are stacked. For example, the memory chips 411 may include a NAND chip and/or a DRAM chip. An adhesive layer 417 may be interposed between the plurality of memory chips 411. For example, the adhesive layer 417 may be a material the same or similar to the non-conductive adhesive layer 317 such as a direct adhesive film (DAF) or a film over wire (FOW). Each of the memory chips 411 may include a bonding pad 413 disposed on an upper surface thereof. A wire 415 may connect bonding pads of adjacent memory chips 411 and may connect one bonding pad 411 to the upper pad 103 of the package substrate 100.

Each of the first and second spacer chips 220S and 230S may have a groove pattern in which a plurality of grooves G are arranged in a grid shape on an upper surface thereof. As shown in FIG. 7, the groove pattern of the first spacer chip 220S may be the same as or similar to a groove pattern of the second spacer chip 230S, but in some embodiments, the groove patterns of the first and second spacer chips 220S and 230S may have other arrangements described above.

The plurality of grooves G not only enhance the bonding strength between the non-conductive adhesive layer 317 and the first and second spacer chips 220S and 230S by providing a non-flat (e.g., larger area) bonding interface, but also may prevent an uncured resin from flowing into the region of bonding interface of the upper edge of the first and second spacer chips 220S and 230S during the process of forming the molded portion 500.

Figure 9:
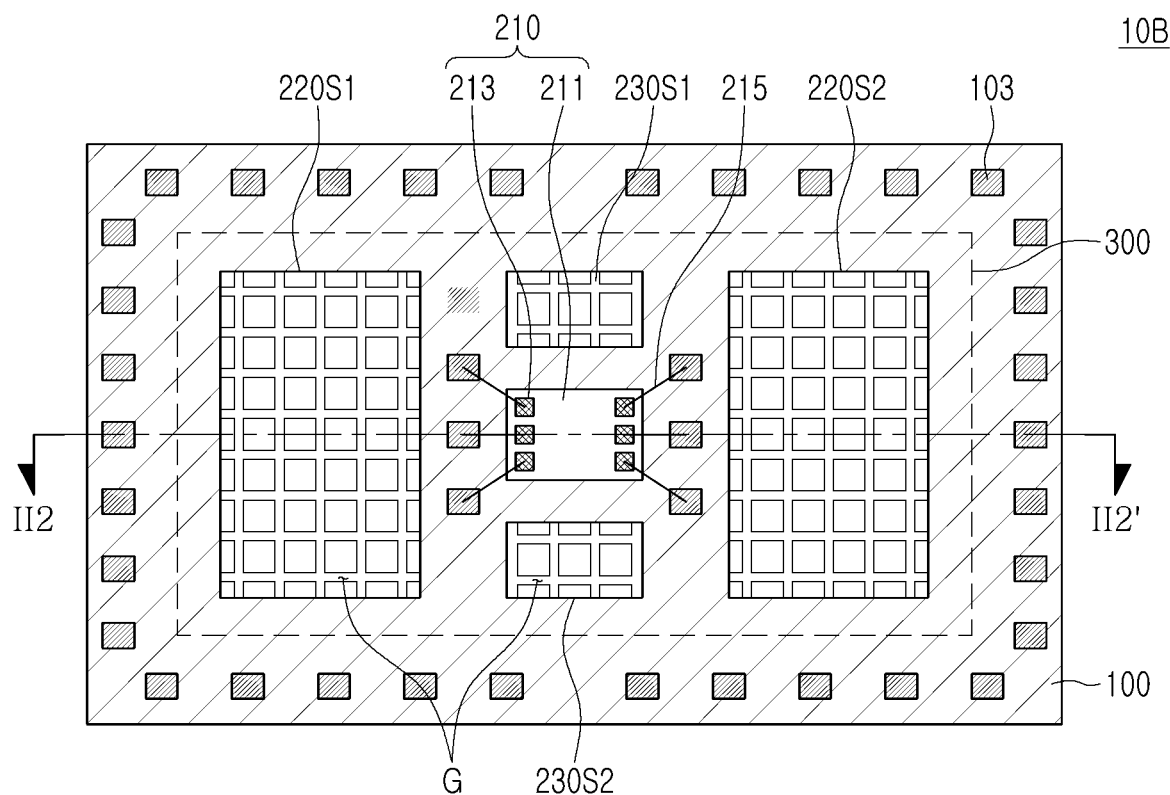
FIG. 9 is a plan view of a semiconductor package according to an example embodiment of the present inventive concept.
Figure 10:
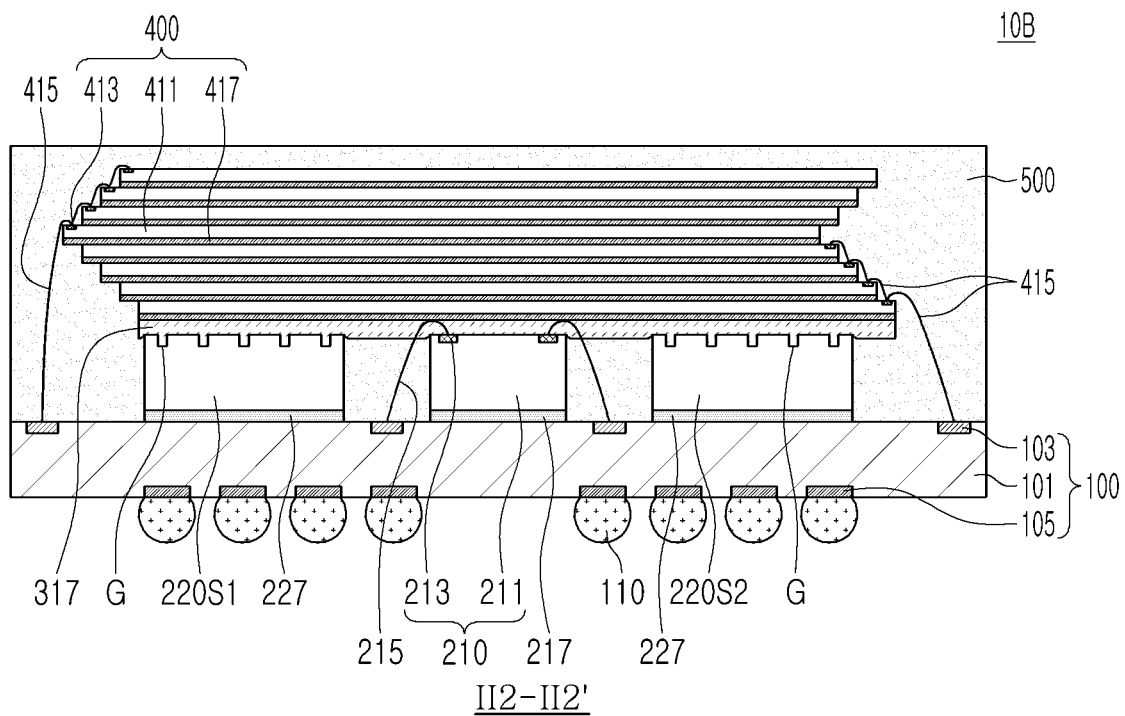
FIG. 10 is a cross-sectional view taken along line II2-II2' of the semiconductor package of FIG. 9.

FIG. 9 is a plan view of a semiconductor package according to an example embodiment of the present inventive concept, and FIG. 10 is a cross-sectional view of the semiconductor package of FIG. 9 taken along a line 112-112'. Referring to FIGS. 9 and 10, it may be understood that a semiconductor package 10B according to the present example embodiment has a structure, similar to the example embodiment shown in FIGS. 1 to 3, except for four spacer chips 220S1, 220S2, 230S1 and 230S2 are employed, and an upper semiconductor chip 400 is a chip stack structure. Accordingly, the description of the example embodiment shown in FIGS. 1 to 3 may be combined with the description of the present example embodiment unless otherwise specified.

The semiconductor package 10B according to the present example embodiment may include a package substrate 100, a lower semiconductor chip 210 disposed on the package substrate 100, two first spacer chips 220S1 and 220S2 and two second spacer chips 230S1 and 230S2 disposed on the package substrate 100, and an upper semiconductor chip 400 disposed on the lower semiconductor chip 210 and the first and second spacer chips 220S1, 220S2, 230S1 and 230S2. These first and second spacer chips 220S1, 220S2, 230S1, and 230S2 are employed to provide a lower structure that stably supports the upper semiconductor chip 300. Each of the two first spacer chips 220S1 and 220S2 may have a size larger than that of the two second spacer chips 230S1 and 230S2, as shown.

As further shown in FIG. 9, the lower semiconductor chip 210 may have a relatively small size, and may be disposed almost in the center of the package substrate 100. The two first spacer chips 220S1 and 220S2 may be disposed to be adjacent to side surfaces of the lower semiconductor chip 210, respectively, located in a first direction, and the two second spacer chips 230S1 and 230S2 may be disposed to be adjacent to side surfaces of the lower semiconductor chip 210, respectively, located in a second direction, perpendicular to the first direction.

The upper semiconductor chip 300 may be bonded to an upper surface of the lower semiconductor chip 210 and upper surfaces of the first and second spacer chips 220S1, 220S2, 230S1, and 230S2 by the non-conductive adhesive layer 317. The upper semiconductor chip 300 may be disposed to cover the upper surface of the lower semiconductor chip 210 and the upper surfaces of the first and second spacer chips 220S1, 220S2, 230S1 and 230S2. The upper semiconductor chip 300 may have an area larger than in a region in which the first and second spacer chips 220S1, 220S2, 230S1 and 230S2 are mounted.

The upper semiconductor chip 400 may be a chip stack structure in which a plurality of memory chips 411 are stacked. Regarding the upper semiconductor chip 400 employed in the present example embodiment, it may be combined with reference to the items described in FIG. 8.

Each of the first and second spacer chips 220S1, 220S2, 230S1, and 230S2 may have a groove pattern in which a plurality of grooves G are arranged in a grid shape on an upper surface thereof. As shown in FIG. 9, the first and second spacer chips 220S1, 220S2, 230S1, 230S2 may be the same as or similar to the groove pattern of the second spacer chip 230S, but in some example embodiments, at least one spacer chip may have a groove pattern of a different arrangement.

The plurality of grooves G not only enhance the bonding strength between the non-conductive adhesive layer 317 and the first and second spacer chips 220S1, 220S2, 230S1 and 230S2 by providing a non-flat bonding interface, but also inhibit an uncured resin from flowing into a region of the bonding interface of the upper edge of the first and second spacer chips 220S1, 220S2, 230S1, and 230S2 during the process of forming the molded portion 500.

Figure 11:
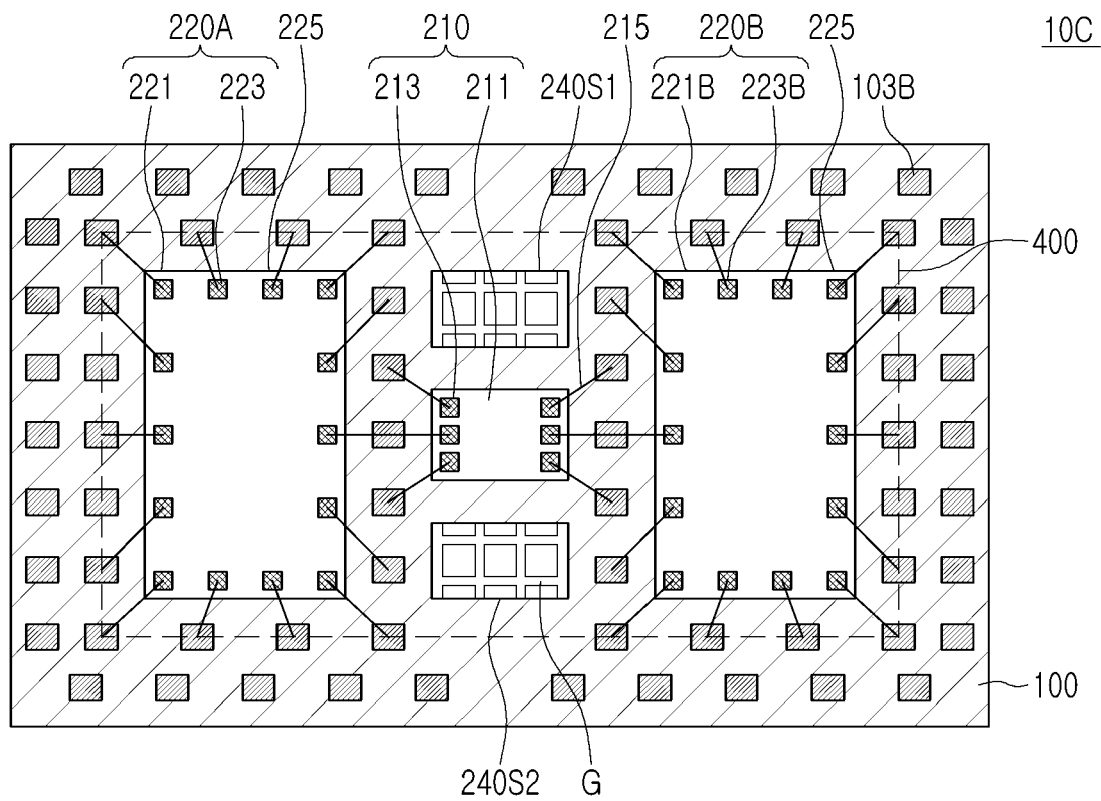
FIG. 11 is a plan view of a semiconductor package according to an example embodiment of the present inventive concept.

FIG. 11 is a plan view of a semiconductor package according to an example embodiment of the present inventive concept. A semiconductor package 10C according to the present example embodiment may be understood as a modified example of the semiconductor package 10B shown in FIGS. 9 and 10.

Referring to FIG. 11, it may be understood that the semiconductor package 10C according to the present example embodiment has a structure, similar to the example embodiment shown in FIGS. 9 and 10, except that two spacer chips 240S1 and 240S2 are introduced, and two second lower semiconductor chips 220A and 220B are further included. Accordingly, the description of the example embodiment shown in FIGS. 9 and 10 may be combined with the description of the present example embodiment unless otherwise specified.

The semiconductor package 10C according to the present example embodiment may include a package substrate 100, a first lower semiconductor chip 210 and two second lower semiconductor chips 220A and 220B disposed on the package substrate 100, two spacer chips 240S1 and 240S2 disposed on the package substrate 100, and an upper semiconductor chip 400 disposed on upper surfaces of the first lower semiconductor chip 210 and the two second lower semiconductor chips 220A and 220 and upper surfaces of the spacer chips 240S1 and 240S2.

The second lower semiconductor chips 220A and 220B may include a semiconductor substrate 221 having an active surface and an inactive surface, opposite to the active surface and bonding pads 223 provided on the active surface, respectively, similar to the first lower semiconductor chip 210. The lower semiconductor chip 210 may be bonded to the upper surface of the package substrate 100 using an adhesive layer 217. The bonding pads 223 of the second lower semiconductor chips 220A and 220B may be connected to an upper pad 103 of the package substrate 100 by a wire 225. Each of the two first spacer chips 240S1 and 240S2 employed in this embodiment may be provided as a lower structure stably supporting the upper semiconductor chip 400 together with other lower semiconductor chips 210, 220A, and 220B.

As shown in FIG. 11, the first lower semiconductor chip 210, which is relatively small, may be disposed almost at the center of the package substrate 100, the two second lower semiconductor chips 220A and 220B may be disposed adjacent to side surfaces of the first lower semiconductor chip 210, respectively located in a first direction, and the two spacer chips 240S1 and 240S2 may be disposed adjacent to side surfaces of the first lower semiconductor chip 210, respectively located in a second direction, perpendicular to the first direction. This arrangement may be determined to ensure stable support of the upper semiconductor chip 400 having a relatively large size. For example, depending on the size of the upper semiconductor chip 400, the number and size of the lower semiconductor chips 210, 220A, and 220B, and the number and size of required spacer chips may be determined.

Each of the spacer chips 240S1 and 240S2 may have a groove pattern in which a plurality of grooves G are arranged in a grid shape on an upper surface thereof. As illustrated in FIG. 11, the groove pattern of the spacer chips 240S1 and 240S2 may be the same or similar to each other, but in some example embodiments, groove patterns of different arrangements may be provided. The plurality of grooves G not only enhance the bonding strength between the non-conductive adhesive layer 317 and the spacer chips 240S1 and 240S2 by providing a non-flat bonding interface, but also may prevent an uncured resin flowing into a region of the bonding interface of an edge of the upper surface of the spacer chips 240S1 and 240S2 during the process of forming the molded portion 500.

Additional second lower semiconductor chips 220A and 220B employed in the present example embodiment are illustrated as two having the same area, but in another example embodiment, the additional second lower semiconductor chips may have different sizes or different numbers, and may also be arranged in other shapes (e.g., asymmetrically).

Figure 12:
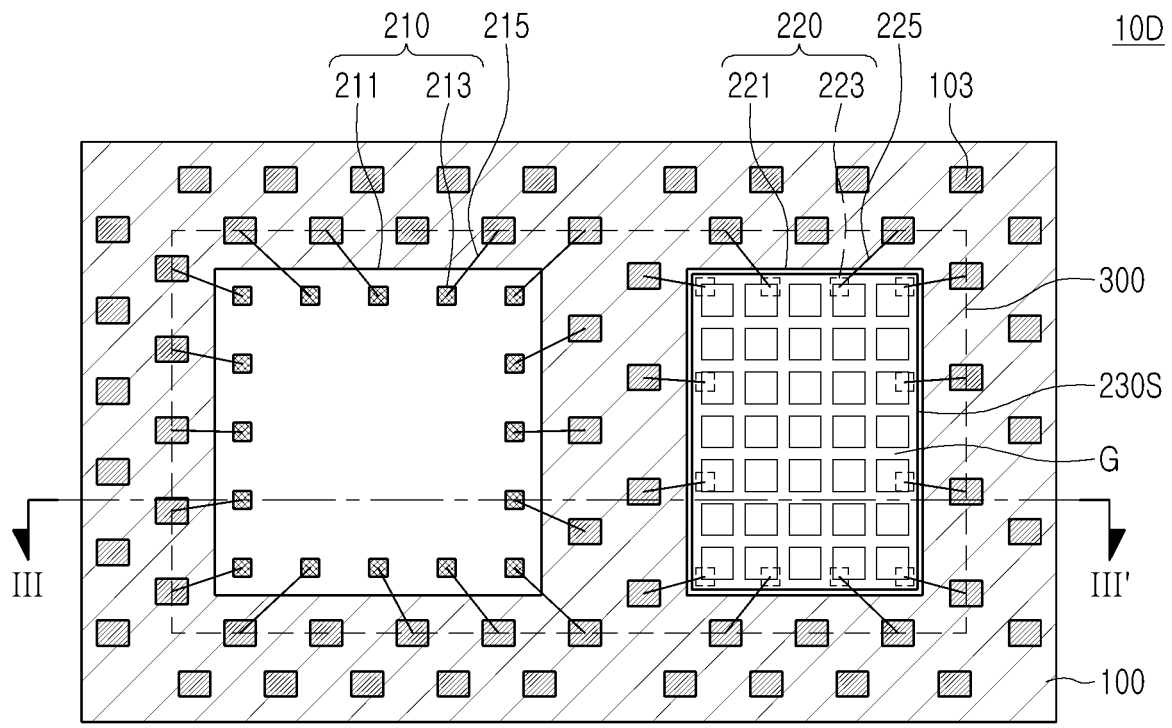
FIG. 12 is a plan view of a semiconductor package according to an example embodiment of the present inventive concept.
Figure 13:
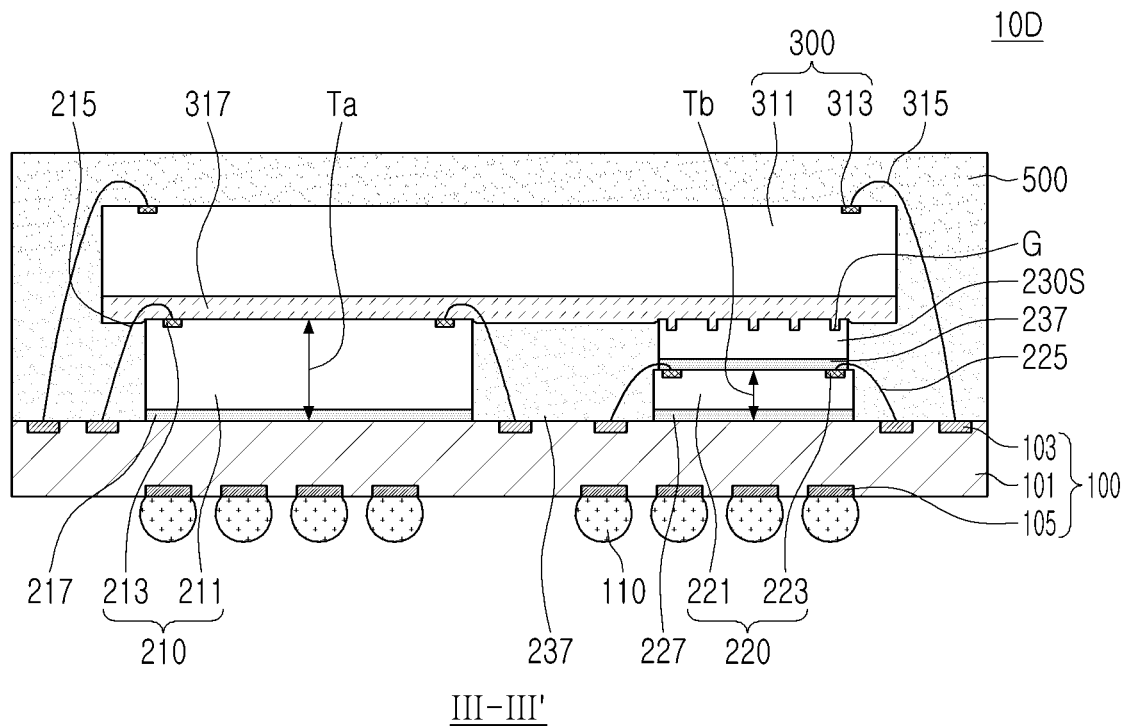
FIG. 13 is a side cross-sectional view taken along line III-III' of the semiconductor package of FIG. 12.

FIG. 12 is a plan view of a semiconductor package according to an example embodiment of the present inventive concept, and FIG. 13 is a side cross-sectional view of the semiconductor package of FIG. 12 taken along a line III-III'. Referring to FIGS. 12 and 13, a semiconductor package 10D according to the present example embodiment includes a plurality of lower semiconductor chips 210 and 220, and it may be understood as a structure, similar to the example embodiment shown in FIGS. 1 to 3, except for a stack structure of a second semiconductor chip 220) among the lower semiconductor chips and a spacer chip 230S. Therefore, the description of the example embodiment shown in FIGS. 1 to 3 may be combined with the description of the present example embodiment unless otherwise specified.

The semiconductor package 10D according to the present example embodiment includes a package substrate 100, first and second lower semiconductor chips 210 and 220 disposed on the package substrate 100, a spacer chip 230S disposed on the second lower semiconductor chip 220, and an upper semiconductor chip 300 disposed on the first lower semiconductor chips 210 and the spacer chip 230.

In the present example embodiment, since a difference in mounting heights (Ta>Tb) of the first and second lower semiconductor chips 210 and 200 is remarkably large, the difference thereof may be reduced by disposing the spacer chip 230S on the second lower semiconductor chip 220. The spacer chip 230S may be disposed on an active surface of the second lower semiconductor chip 220 using an adhesive layer 237. As a result, a height of a stack structure of the second lower semiconductor chip 220 and the spacer chip 230S may be close to or substantially the same as the height of the first lower semiconductor chip 210.

Referring to FIG. 13, an upper semiconductor chip 300 may be bonded to the active surface of the first lower semiconductor chips 210 and an upper surface of the spacer chip 230S by a non-conductive adhesive layer 317. The upper semiconductor chip 300 may be disposed to cover the active surface of the first lower semiconductor chip 210 and the upper surfaces of the spacer chip 230S.

As shown in FIG. 12, the spacer chip 230S may have an upper surface in which a plurality of grooves G are arranged in a grid shape. The plurality of grooves G not only enhance bonding strength between the non-conductive adhesive layer 317 and the spacer chip 230 by providing a non-flat bonding interface, but also prevent an uncured resin from entering a region of the boding interface of an edge of the upper surface of the spacer chip 230S.

Figure 14:
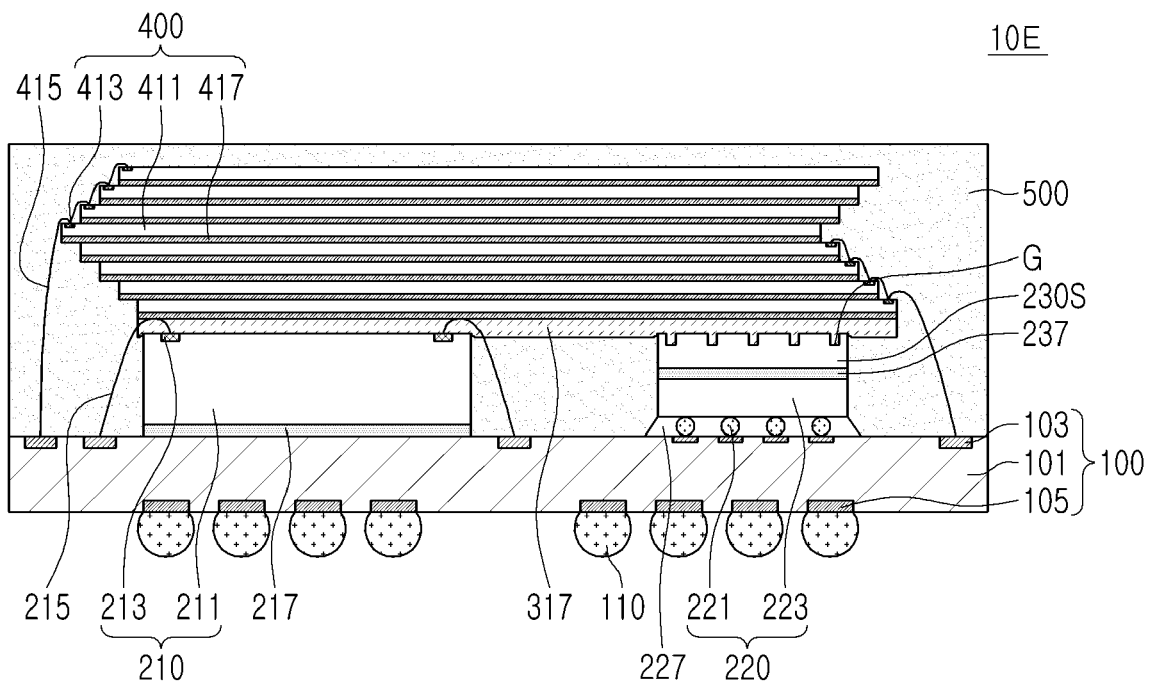
FIG. 14 is a side cross-sectional view of a semiconductor package according to an example embodiment of the present inventive concept.

FIG. 14 is a side cross-sectional view of a semiconductor package according to an example embodiment of the present inventive concept. A semiconductor package 10E according to the present example embodiment may be understood as a modified example of the semiconductor package 10D illustrated in FIGS. 12 and 13.

Referring to FIG. 14, the semiconductor package 10E according to the present example embodiment can be understood as a structure similar to the embodiment shown in FIGS. 12 and 13 except that the upper semiconductor chip 400 is a chip stack structure. Accordingly, the description of the present example embodiment shown in FIGS. 12 to 13 may be combined with the description of the present example embodiment unless otherwise specified.

The upper semiconductor chip 400 employed in this embodiment may be a chip stack structure similar to the shape shown in FIGS. 8 and 10. The upper semiconductor chip 400 may be a chip stack structure in which a plurality of memory chips 411 are stacked. For example, the memory chips 411 may include a NAND chip and/or a DRAM chip. An adhesive layer 417 may be interposed between the plurality of memory chips 411. Each of the memory chips 411 may include a bonding pad 413 disposed thereon. A wire 415 may connect bonding pads of adjacent memory chips 411, and may connect one bonding pad 411 to the upper pad 103 of the package substrate 100.

The upper semiconductor chip 400 may be bonded to the upper surface of the first lower semiconductor chip 210 and the upper surface of the spacer chip 230S by the non-conductive adhesive layer 317. The upper semiconductor chip 400 may be disposed to cover the upper surface of the first lower semiconductor chip 210 and the upper surface of the spacer chip 230. Even in this case, the plurality of grooves G formed on the upper surface of the spacer chip 230 not only enhance the bonding strength between the non-conductive adhesive layer 317 and the spacer chip 230S by providing a non-flat bonding interface, but also prevent an uncured resin from entering a region of the bonding interface of the edge of the upper surface of the spacer chip 230S in a process of forming the molded portion 500.

As set forth above, in a stacked semiconductor package, by processing the upper surface of the spacer chip for supporting the upper semiconductor chip into an uneven surface, not only the bonding strength with the non-conductive bonding layer may be increased, but also the resin of the molded portion can effectively prevent penetration into the bonding interface. As a result, the reliability of the semiconductor package can be improved.

Various and advantages and effects of the present inventive concepts are not limited to the above description.

While example embodiments have been illustrated and described above, it will be apparent to those skilled in the art that modifications and variations could be made without departing from the scope of the present inventive concepts as set forth by the appended claims.

What is claimed is:

1. A semiconductor package comprising:
   a substrate having a lower semiconductor chip and at least a first spacer chip thereon, said first spacer chip having a stress-relieving groove pattern on an upper surface thereof;
   an upper semiconductor chip extending on the lower semiconductor chip and on the first spacer chip, said upper semiconductor chip covering at least a portion of an upper surface of the lower semiconductor chip and at least a portion of the upper surface of the first spacer chip containing at least a portion of the groove pattern therein;
   an electrically nonconductive adhesive layer, which bonds a lower surface of the upper semiconductor chip to the lower semiconductor chip and to the first spacer chip; and
   a mold region, which at least partially surrounds the lower and upper semiconductor chips and the first spacer chip and extends at least partially into the groove pattern.

2. The semiconductor package of claim 1, wherein the groove pattern includes a plurality of grooves arranged in a grid shape; and wherein the mold region contacts the electrically nonconductive adhesive layer.

3. The semiconductor package of claim 2, wherein the plurality of grooves include at least some grooves that extend to edges of the upper surface of the first spacer chip.

4. The semiconductor package of claim 1, wherein the groove pattern includes a groove extending along at least one edge of the upper surface of a first spacer chip.

5. The semiconductor package of claim 1, wherein the groove pattern includes a plurality of grooves, which are spaced apart from respective edges of the upper surface of the first spacer chip.

6. The semiconductor package of claim 1, wherein at least a portion of the mold region extends and fills a space between the lower semiconductor chip, the first spacer chip, and the upper semiconductor chip.

7. The semiconductor package of claim 1, wherein a width of a groove within the groove pattern is within a range from 15 μm to 30 μm.

8. The semiconductor package of claim 1, wherein a depth of a groove within the groove pattern is within a range from 0.5 μm to 3 μm.

9. The semiconductor package of claim 1, wherein the at least a first spacer chip includes first and second spacer chips of different size.

10. The semiconductor package of claim 9, wherein the first and second spacer chips extend opposite first and second sides of the lower semiconductor chip.

11. The semiconductor package of claim 1, wherein the at least a first spacer chip comprises first through fourth spacer chips which extend opposite first through fourth sides of the lower semiconductor chip, respectively.

12. The semiconductor package of claim 1, further comprising a second lower semiconductor chip on the substrate; and wherein the first spacer chip extends between the second lower semiconductor chip and the lower surface of the upper semiconductor chip.

13. The semiconductor package of claim 1, further comprising at least one bonding wire extending between the substrate and the lower semiconductor chip.

14. The semiconductor package of claim 1, wherein the lower semiconductor chip is a processor chip, and the upper semiconductor chip is a memory chip.

15. The semiconductor package of claim 1, further comprising a second lower semiconductor chip extending between the first spacer chip and the substrate.

16. A semiconductor package, comprising:
a substrate;
a lower semiconductor chip on the substrate;
a plurality of spacer chips having respective upper surfaces thereon, which contain a grid pattern of grooves therein;
an upper semiconductor chip on the lower semiconductor chip and on the upper surfaces of the plurality of spacer chips;
an electrically nonconductive adhesive layer, which is bonded between a lower surface of the upper semiconductor chip and an upper surface of the lower semiconductor chip and between the lower surface of the upper semiconductor chip and the upper surfaces of the plurality of spacer chips; and
a mold region at least partially surrounding the lower and upper semiconductor chips and the plurality of spacer chips, and at least partially filling a space between the lower semiconductor chip and the plurality of spacer chips, which is covered by the upper semiconductor chip, and at least partially extending into a portion of the grid pattern of grooves.

17. The semiconductor package of claim 16, wherein the grooves in the upper surfaces of the plurality of spacer chips extend to corresponding edges of the upper surfaces of the plurality of spacer chips.

18. The semiconductor package of claim 16, wherein the grooves have a width in a range from 15 μm to 30 μm and a depth within a range from 0.5 μm to 3 μm; and wherein a spacing between the plurality of grooves is at least 1.5 times a width of each of the grooves, and is within a range from 20 μm to 100 μm.

* * * * *